United States Patent [19]

Lucitte et al.

[11] Patent Number: 4,861,140

[45] Date of Patent: Aug. 29, 1989

[54] METHOD OF MAKING A THIN LENS

[75] Inventors: Richard D. Lucitte, Holcomb; Paul W. Melnychuck, West Henrietta; Joseph J. Murray, Rochester; Lawrence A. Ray, Brockport; James R. Sullivan, Spencerport, all of N.Y.

[73] Assignee: Eastman Kodak Company, Rochester, N.Y.

[21] Appl. No.: 242,260

[22] PCT Filed: Jan. 13, 1988

[86] PCT No.: PCT/US88/00155

§ 371 Date: Jan. 13, 1988

§ 102(e) Date: Jan. 13, 1988

[51] Int. Cl.$^4$ .............................................. G02B 27/00
[52] U.S. Cl. ...................................... 350/320; 350/321
[58] Field of Search ............... 350/320, 321, 412, 413, 350/417; 355/51, 53; 430/5, 6, 31, 40, 327, 370

[56] References Cited

U.S. PATENT DOCUMENTS

| | | | |
|---|---|---|---|
| 4,389,482 | 6/1983 | Bargon et al. | 430/327 |
| 4,461,825 | 7/1984 | Kato et al. | 430/327 |
| 4,581,316 | 4/1986 | Yamanouchi | 430/5 |
| 4,609,259 | 9/1986 | Suemitsu et al. | 350/417 |
| 4,778,256 | 10/1988 | Serizawa | 350/320 |

Primary Examiner—Bruce Y. Arnold
Assistant Examiner—Loha Ben
Attorney, Agent, or Firm—Thomas H. Close

[57] ABSTRACT

A method of making a thin lens having a desired high order curvature includes the steps of providing a layer of transparent photoresist; generating a continuous tone exposure pattern for exposing the photoresist such that when exposed and developed the layer of photoresist will possess the desired high order curvature; exposing the layer of photoresist; and developing the layer to produce the thin lens.

7 Claims, 6 Drawing Sheets

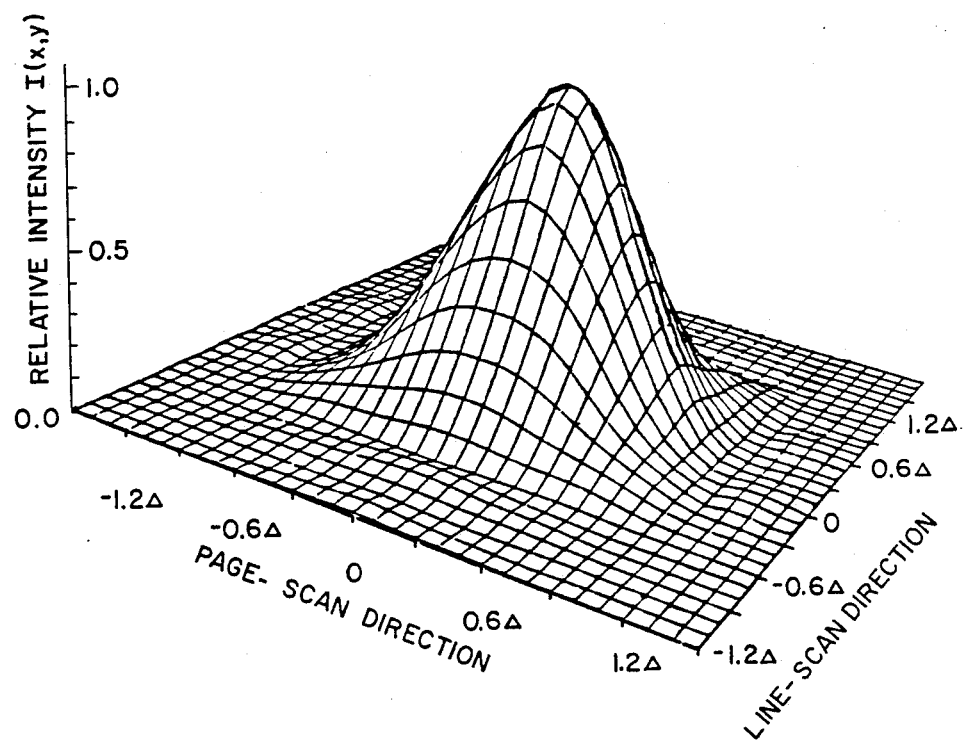
FIG. 4
FIG. 5
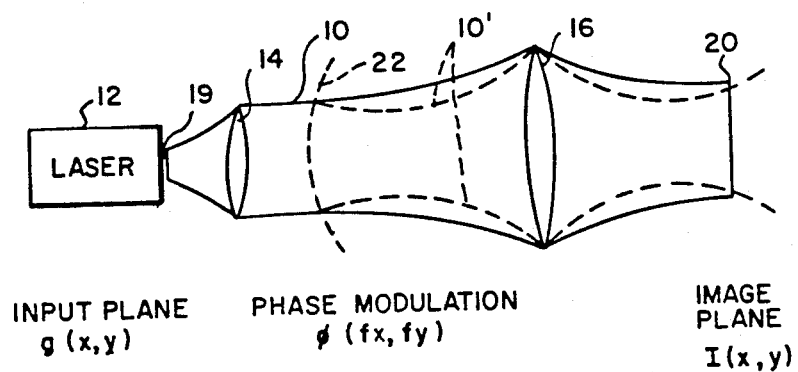
INPUT PLANE
$g(x,y)$
PHASE MODULATION
$\phi(fx, fy)$
IMAGE PLANE
$I(x,y)$

METHOD OF MAKING A THIN LENS

TECHNICAL FIELD OF THE INVENTION

The present invention relates to a method of fabricating a thin lens, for example a thin lens phase mask employed to shape the intensity profile of a laser beam in a laser beam recorder. More particularly, the invention is directed to a method of fabricating a thin lens having a continuously variable thickness of high order curvature.

BACKGROUND OF THE INVENTION

It is known to employ a phase mask or phase grating in the Fourier plane of laser beam projection objects to modify the intensity profile of the laser beam at the image plane. Phase masks may modulate the amplitude (called transmission masks or gratings) or the phase (called pure phase masks) of the laser beam at the Fourier plane. The pure phase mask is actually a thin lens, often requiring a high order of surface curvature.

In applications where the laser power is limited, thin lens phase masks are preferred since they are 100% transmissive and do not reduce the intensity of the laser beam at the image plane. Pure phase masks may be formed as binary phase masks, where the thickness of transparent material forming the mask is varied in a step wise pattern, or continuous phase masks, where the thickness is varied smoothly. Methods for making binary phase masks are well known and straight forward. Because binary phase masks are easy to fabricate, they are generally preferred over continuously variable phase masks. For example, see the article "Spot Shaping and Incoherent Optical Smoothing for Raster Scanned Imagery," by Robert A. Gonsalves and Philip S. Considine, Optical Engineering, January-February 1976, Vol. 15, No. 1, page 64-67, where the authors chose to fabricate a binary phase mask because the ease of manufacture.

Recently, two of the present inventors have shown, through theoretical modeling studies of the beam shaping process, that an ideal spot intensity distribution can only be approximated using a binary phase mask, and that better results will be achieved with a thin lens continuous phase mask. See the article, "Modification of Laser Recording Beam for Image Quality Improvement," by J. Sullivan and L. Ray, Applied Optics, 1 May 1987, Vol. 26, No. 9, page 1765-17. In the article, the authors address the problem of modifying the intensity profile of a laser beam in a laser beam recorder to maximize the sharpness and minimize aliasing in a continuous tone image produced by the laser beam recorder. The use of a thin lens continuous phase mask to modulate the Gaussian amplitude of an inexpensive diode laser source would make it possible to use the diode laser to produce high quality images on fine grain photosensitive materials. As pointed out in the article, the minimum-error, two-dimensional spot intensity distribution for recording the sharpest digital image with minimal aliasing is a function of the image correlation, the discrete sampling lattice, and the temporal transfer function of the recorder. For a radially symmetric image correlation function of the form $\exp(-k|r|)$ (where k is a constant and r is radial distance), a square sampling grid, and a uniform temporal blur function in the line-scan direction, the minimum-error intensity distribution $I(x,y)$ is as shown in FIG. 4, where the relative intensity is plotted against page and line scan directions in relative units of the sampling spacing $\Delta$. To achieve this intensity distribution with a diode laser having an elliptical Gaussian intensity profile, the source distribution is phase modulated in the Fourier plane with a continuous phase mask.

FIG. 5 is a schematic diagram of a beam forming system employing a thin lens phase mask in the Fourier plane. The laser beam, illustrated by beam waists 10, is generated by a laser 12. The beam forming optics include a relay lens 14, and an objective lens 16 that forms an image of the input plane 19 onto an image plane 20. A phase mask 22 is positioned at the Fourier plane of the relay lens 14. The Fourier plane lies one focal distance from the relay lens 14. The phase mask 22 reshapes the beam intensity profile and modifies the beam waist as shown by dashed lines 10 prime in FIG. 5. With proper choice of the phase mask 22, the desired intensity profile of FIG. 4 is formed in the image plane.

For a continuous phase modulation $\phi(f_x, f_y)$ of finite extent the overall system transfer function is given by the modulus of the Fourier transform of the exposure distribution, which is given by the convolution of the intensity distribution and the line-scan temporal blur function, that is:

$$MTF(f_x,f_y) = |F\{T(x) \otimes |F^{-1}[e^{j\phi(f_x,f_y)}G(f_x,f_y)]|^2\}| \qquad (1)$$

where $f_x$ is spatial frequency in the line-scan direction, $f_y$ is spatial frequency in the page-scan direction, $G(f_x,f_y)$ is the Fourier transform of the source amplitude distribution $g(x,y)$, $T(x)$ is the temporal transfer function, and F represents Fourier transformation. The squared error between this transfer function and the desired transfer function defined by the Fourier transfer of the minimum-error intensity distribution and the line-scan blur function is minimized by choosing the appropirate phase modulation. For even, polynomial phase, the resultant two-dimensional phase profile is smooth and, therefore, can be realized by thickness variations in optically transmissive material with an index of refraction that is different than that of air (i.e. by a thin lens of high order curvature). FIG. 6 shows the phase profile of a continuous phase mask for shaping a laser beam having an elliptical Gaussian profile to the intensity profile of FIG. 4.

Physical realization of the desired phase profile for the thin lens continuous phase mask prevents a problem, since the higher order curvature requirements (e.g. beyond second order) for extreme phase manipulation preclude techniques such as conventional optical grinding. Furthermore, plastic injection molding does not provide the subtle thickness variations (within $\lambda/8$) over the small areas that phase manipulation requires (typical mask dimensions are $5 \times 5$ mm square).

It is therefore an object of the present invention to provide an improved method of making a thin lens, and particularly a thin lens continuous phase mask for laser spot shaping. It is a further object of the invention to provide such a method capable of producing continuous optical surfaces having third and higher order curvatures.

SUMMARY OF THE INVENTION

The objects of the invention are achieved by providing a layer of transparent photoresist; generating a continuous tone pattern for exposing the photoresist such that when exposed and developed, the layer of photoresist will possess the high order curvature; exposing the layer of photoresist; and developing the layer to produce the thin lens.

According to a preferred mode of practicing the invention, the photoresist is a positive working photoresist that is exposed through an intermediate mask prepared by exposing and developing a high resolution photographic film.

BRIEF DESCRIPTION OF THE DRAWINGS

FIG. 4 is a graph illustrating a desired laser beam intensity distribution for a scan printer;

FIG. 5 is a schematic diagram showing the location and effect of a phase mask in a laser beam optical system;

MODES OF CARRYING OUT THE INVENTION

Ordinarily, photoresist which has a large thickness dynamic range and very high contrast, is exposed in a binary mode, i.e. after exposure and development the photoresist is either completely removed from an area or left with its full thickness to produce a stepwise pattern of resist on a substrate. According to the present invention, the photoresist is exposed in a continuous manner such that a continuously variably thickness is produced in the developed photoresist to form the thin lens. To provide the continuously varible exposure, the photoresist could be exposed directly, pixel by pixel in a scanner. However, since most photoresists are exposed by ultraviolet (UV) light, and UV scanners are not generally available, the presently preferred manner of exposing the photoresist is by means of an intermediate high resolution photographic master (a negative in the case of a negative working resist, or positive in the case of positive working resist). The intermediate high resolution photographic master is prepared by exposing a fine grain photographic master is prepared by exposing a fine grain photographic film in a conventional film scanner. To produce the desired thickness in the photoresist, knowledge of the UV exposure versus thickness response of the photoresist, and exposure versus UV density of the intermediate film is required. When these responses plus the index of refraction n and the wavelength $\lambda$ of the laser beam that will be shaped by the thin lens are known, a table is generated, as described in more detail below, relating desired phase to visible light exposure of the intermediate mask.

Figure 1:
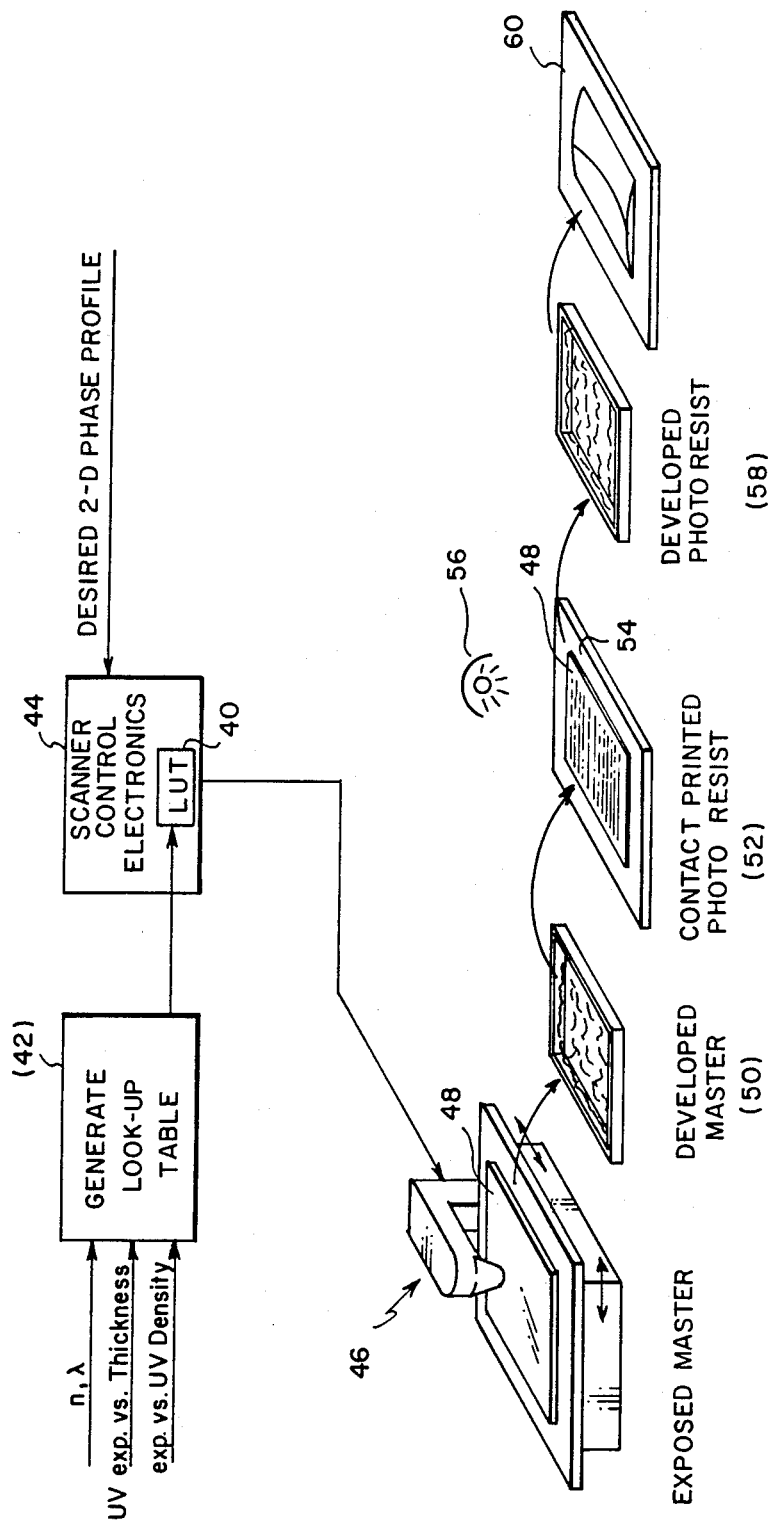
FIG. 1 is a schematic diagram illustrating steps in the method of fabricating a thin lens continuous phase mask according to the present invention.

The steps of making a thin lens according to the preferred mode of practicing the invention are shown in FIG. 1. First, a computer lock up table 40 is generated (42) relating a desired phase shift versus integer code value necessary to generate the intermediate mask exposure, by cascading the measured UV exposure versus thickness function for the photoresist and the measured exposure versus UV density function for the high resolution photographic film. The thickness of the photoresist is related to the phase shift by $$t(x,y) = \phi(x,y)(\lambda/n - 1), \qquad (2)$$

where
$t(x,y)$ is the thickness profile;
$\phi(x,y)$ is the desired phase profile;
$\lambda$ is the wavelength of the laser beam to be shaped by the phase mask; and
n is the index of refraction of the photoresist at wavelength $\lambda$.

The look up table 40 is stored in the control electronics 44 of an x,y film scanner 46 such as a flat bed scanner. The film scanner is driven in a conventional manner by supplying the desired two-dimensional phase profile to the control electronics to expose the fine grain photographic film 48. Scanner control electronics converts the phase information to scanner exposure by addressing look up table 40.

The intermediate film master 48 is developed (50) and then contact printed (52) onto the layer of photoresist 54 (which is coated onto a transparent support such as glass (using an ultraviolet lamp 56. The photoresist is then developed (58) to produce the thin lens continuous phase mask 60.

Figure 2:
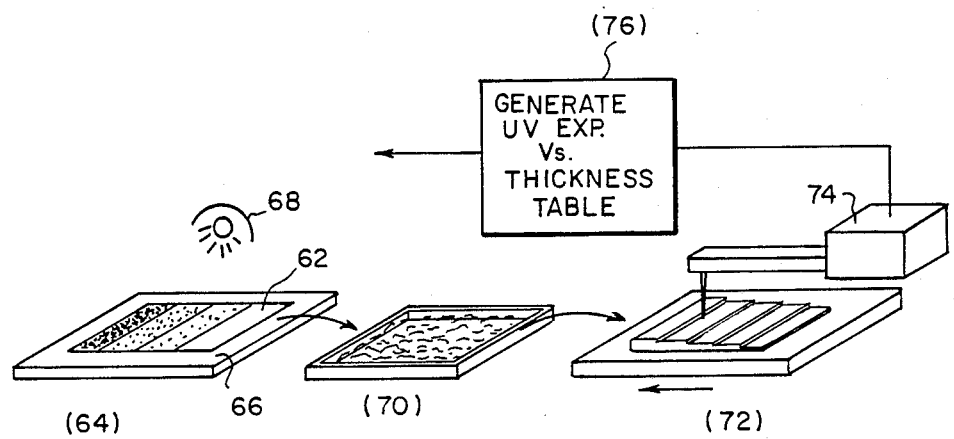
FIG. 2 is a schematic diagram showing the process of determining the UV exposure versus thickness for the photoresist employed to fabricate the thin lens phase mask.

FIG. 2 illustrates how the UV exposure versus photoresist thickness function is measured. A step wedge 62 is exposed (64) onto a layer of photoresist 66 with a controlled source of UV light 68. The exposed photoresist is developed (70) and the resulting thickness is measured (72) with a profilometer 74. The UV exposure versus thickness function is generated (76) by interpolating between the measured exposure steps.

Figure 3:
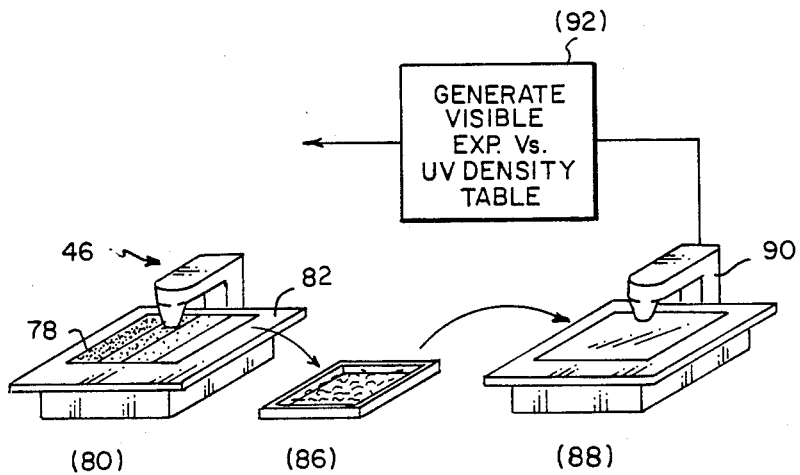
FIG. 3 is a schematic diagram showing the process of determining the exposure versus the UV density of the intermediate mask employed to fabricate the phase mask.

FIG. 3 illustrates the measurement of the exposure versus UV density function of the intermediate photographic film mask. A step wedge 78 is exposed (80) onto the photographic film 82 by the film scanner 46. The exposed film is developed (86) and the developed film image 78 is measured (88) in a UV densitometer 90. The exposure versus UV density function is generated (92) by interpolating between the sample exposure steps.

Alternatively, a visible exposure versus thickness function can be generated directly by exposing and developing the step wedge 78 as shown in FIG. 3, steps (80) and (86), and employing the step wedge 82 thus produced as the step wedge 62 in the process of measuring exposure versus thickness as shown in FIG. 2. The table of values produced thereby, directly relate visible exposure of the film to thickness of the photoresist.

WORKING EXAMPLE

Figure 6:
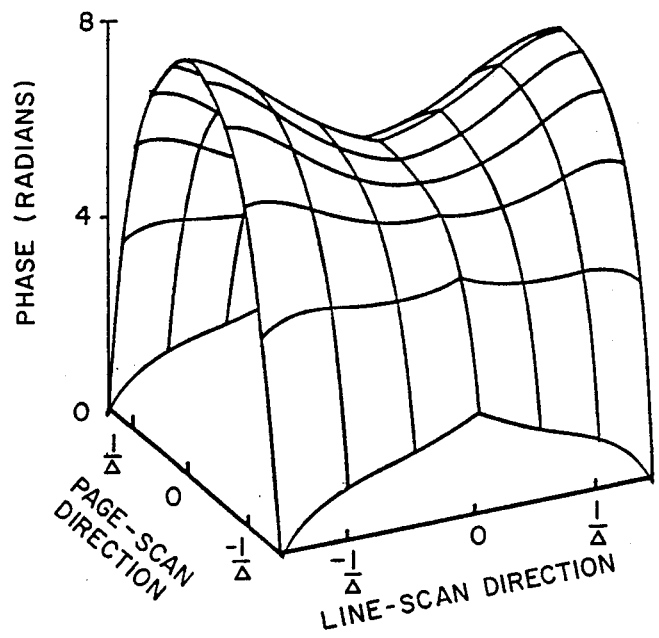
FIG. 6 is a graph showing the phase pattern for a continuous phase mask to shape a laser beam having an elliptical Gaussian intensity profile to the intensity profile shown in FIG. 4.

A thin lens phase mask having the phase profile shown in FIG. 6 for shaping a beam from a diode laser having a wavelength $\lambda = 830$ nm was produced as follows.

Figure 7:
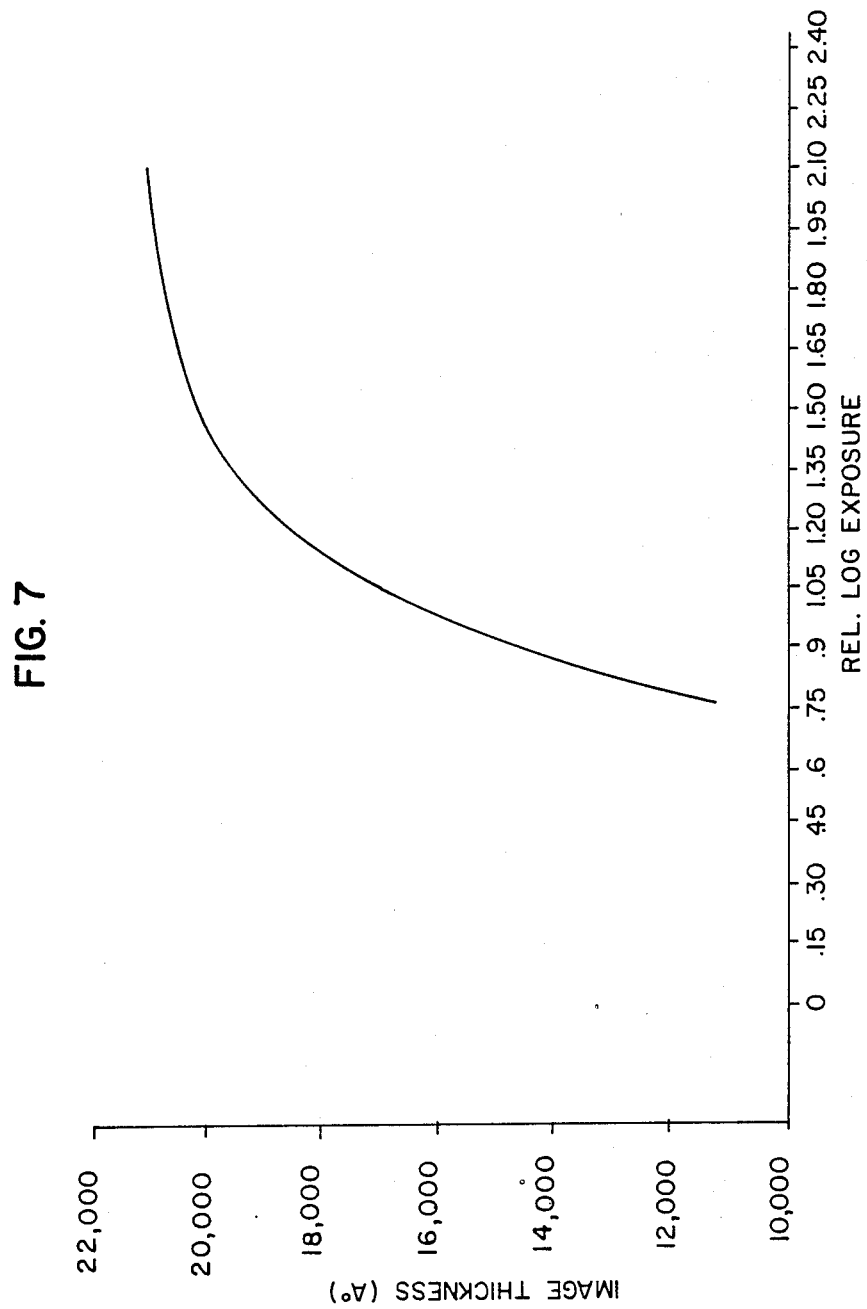

A positive working photoresist comprising a novalak resin with a quinone diazide photoactive agent, available from the Union Carbide Company under the brand name 809 photoresist, was selected. The photoresist was coated on a glass substrate by conventional spin coating techniques. The thickness versus relative UV log exposure of the photoresist was measured as described above with reference to FIG. 2. The resulting function is shown in FIG. 7.

Figure 8:
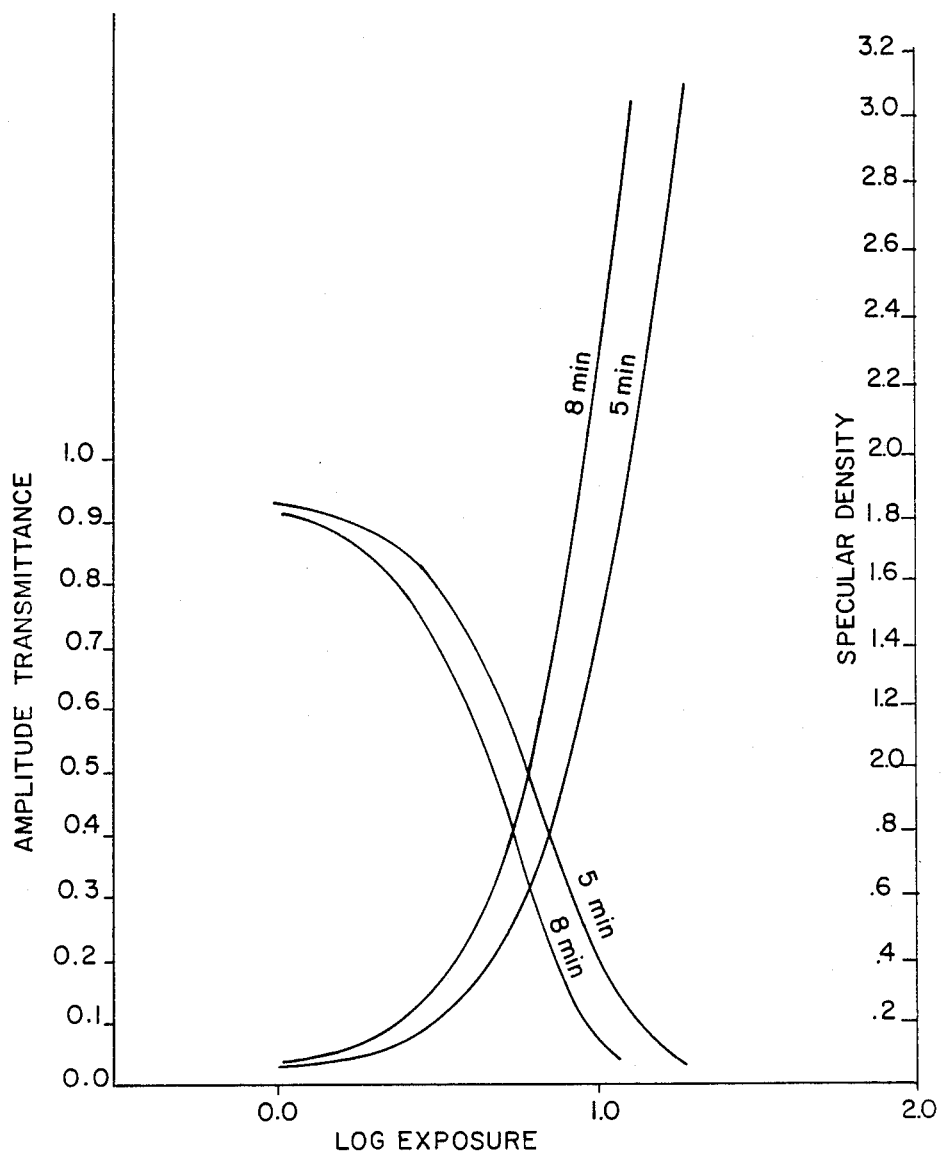

Kodak High Speed Holographic Film Type SO-253 was selected as the intermediate mask film. Exposure versus UV density of the film was measured as described above with reference to FIG. 3. The film was developed in Kodak Developer D-19 at 20° C. with continuous agitation. The resulting exposure versus specular density and amplitude transmittance for 5 and 9 minute development times is shown in FIG. 8.

A look up table relating visible exposure to phase was generated as described above. The computer program employed to generate the look up table is included as Appendix A.

An intermediate mask was prepared by exposing the SO-253 film in the flat bed scanner, having a square scanning spot size of 6×6 micrometers and a red LED light source. The intermediate mask was developed and the mask was contact printed onto a layer of the photoresist coating on a glass substrate. The photoresist was developed in a conventional manner to produce the thin film phase mask. The resulting phase mask had the phase profile shown in FIG. 6 and an overall dimension of 5 mm×5 mm.

Although the invention has been described with reference to a continuous phase mask for shaping the intensity profile of a laser beam in a laser printer, it will be recognized that the method of the present invention may be employed to fabricate any high order thin lens such as a continuous phase mask for shaping laser beam intensity profiles in other apparatus, for example optical disc recorders/readers, stimulable phosphor scanners, etc. where a particular intensity profile is desired.

INDUSTRIAL APPLICABILITY AND ADVANTAGES

The present invention is useful to produce thin lens phase masks for shaping the intensity profile of laser beams in apparatus such as laser scanners and recorders. The invention provides the advantage that high order continuous phase masks are produced which are superior to the prior art binary phase masks.

Appendix A

```
FILE:  LOOK FORTRAN AL KRCC BLDG 83 VM/SP HPO REL 4.2 3090
FILE:  LOOK FORTRAN A KRCC BLDG 83 HPO 4.2
       PROGRAM LOOK
C      CREATES A LOOK-UP TABLE FOR LOGE-THICKNESS &
       VISDEN 11BIT
       PARAMETER (NX1=11,NX2=12,IC1=10,IC2=11,IRANGE=212,
       JRANGE=1305)
       REAL*8 LOGE(NX1),THICK(NX1),C1(IC1,3),
       RLOGE(IRANGE),
     1 STHICK(IRANGE),
     2 VISD(NX2),BIT11(NX2),C2(IC2,3),VISDEN(JRANGE),
     3 SBIT11(JRANGE)
       REAL THICK4(IRANGE),VISD4(JRANGE,RLOGE4(IRANGE),
       SBIT4(JRANGE)
       INTEGER MASK(2048)
C      CALIBRATION DATA FOR FILM/SCANNER
       DATA LOGE/.00,.75,.90,1.05,1.20,1.35,1.50,
       1.65,1.80,1.95,2.10/,
     1 THICK/0.,1.12,1.44,1.70,1.84,1.95,2.01,2.06,
       2.08,2.09,2.10/,
     2 VISD/.00,.08,.09,.11,.14,.20,.36,.45,.62,.91,
       1.17,1.30/,
     3 BIT11/0,1,14,63,125,250,592,732,1079,1592,
       1895,2047/
C      CREATE THICKNESS ARRAY IN .01 INCREMENTS
       DO 5 I=1,IRANGE
       STHICK(I)=I/100.
       THICK4(I)=STHICK(I)
    5  CONTINUE
C      CREATE VISUAL DENSITY ARRAY IN .001 INCREMENTS
       DO 10 I=1,JRANGE
       VISDEN(I)=I/1000.
       VISD4(I)=VISDEN(I)
   10  CONTINUE
C      CALL CUBIC SPLINE ROUTINES (FROM IMSL LIBRARY)
       CALL ICSCCU(THICK,LOGE,NX1,C1,IC1,IER1)
       CALL ICSCCU(VISD,BIT11,NX2,C2,IC2,IER2)
       CALL ICSEVU(THICK,LOGE,NX1,C1,IC1,STHICK,RLOGE,
       IRANGE,IER3)
       CALL ICSEVU(VISD,BIT11,NX2,C2,IC2,BISDEN,SBIT11,
       JRANGE,IER4)
C      WRITE LOGE-THICKNESS LOOKUP TABLE TO FILE 'LOOK1'
       OPEN(UNIT=15,FILE='LOOK1')
       DO 15 I=1,IRANGE
       WRITE(15,30) RLOGE(I)
       RLOG4(I)=RLOGE(I)
   15  CONTINUE
       CLOSE(15)
C      WRITE VISDENS-11BIT LOOKUP TABLE TO FILE 'LOOK2'
       OPEN(UNIT=15,FILE='LOOK2')
FILE:  LOOK FORTRAN AL KRCC BLDG 83 VM/SP HPO REL 4.2 3090
       DO 20 I=1,JRANGE
       MASK(I)=SBIT11(I)
       SBIT4(I)=SBIT11(I)
       WRITE(15,40) MASK(I)
   20  CONTINUE
```

| Appendix A | |
|---|---|
| | CLOSE(15) |
| FILE: | LOOK FORTRAN A KRCC BLDG 83 HPO 4.2 PUT 8608 |
| 30 | FORMAT(F5.3) |
| 40 | FORMAT(I4) |
| C | GENERATE PLOTS OF LOOKUP TABLES USING DISSPLA ROUTINES |
| | IDEV=0 |
| | CALL DEVICE (IDEV) |
| | CALL SWISSL |
| | CALL AREA2D(6.,.4.) |
| | CALL HEADING('THICKNESS-REL LOGE LOOK-UP TABLE$',100,2,1) |
| | CALL XNAME('DESIRED THICKNESS (MICRONS)$',100) |
| | CALL YNAME('RELATIVE LOG EXPOSURE$',100) |
| | CALL GRAF(0.,.5,3.,0.,.5,2.5) |
| | CALL CURVE(THICK4,RLOGE4,IRANGE,0) |
| | CALL ENDPL(0) |
| | CALL AREA2D(6.,.4) |
| | CALL HEADIN('DENSITY-BIT COUNT LOOK-UP TABLE$',100,2,1) |
| | CALL XNAME('VISUAL DENSITY$',100) |
| | CALL YNAME('11 BIT COUNT#',100) |
| | CALL GRAF (0.,.25,1.5,0,500,2050) |
| | CALL CURVE(VISD4,SBIT4,JRANGE,0) |
| | CALL ENDPL(0) |
| | END |

We claim:

1. A method of making a thin lens having a desired high order curvature, comprising the steps of:
   a. providing a layer of transparent photoresist;
   b. generating a continuous tone exposure pattern for exposing the photoresist such that, when exposed and developed, the layer of photoresist will possess the high order curvature;
   c. exposing said layer of photoresist with said exposure pattern; and
   d. developing said layer of photoresist to produce said thin lens.

2. A method of making a continuous phase mask having a desired phase profile, for shaping the spot from a laser beam, comprising the steps of:
   a. providing a layer of photoresist transparent to the laser light;
   b. generating a continuous tone exposure pattern for exposing the photoresist such that, when exposed and developed, the layer of photoresist will possess the desired phase profile;
   c. exposing said layer of photoresist with said exposure pattern; and
   d. developing said layer of photoresist to produce said continuous phase mask.

3. The method claimed in claim 2, wherein that photoresist is positive working photoresist.

4. The method claimed in claim 3, wherein said step of generating a continuous tone exposure pattern comprises the steps of:
   a. computing a required thickness profile for the phase mask as follows:
   $t(x,y) = \phi(x,y)(\lambda/n - 1)$;
   where
   t(x,y) is the required thickness profile,
   $\phi(x,y)$ is the desired phase profile,
   $\lambda$ is the wavelength of the laser light, and
   n is the refractive index of the photoresist at wavelength $\lambda$;
   b. measuring the thickness versus exposure response of the photoresist; and
   c. computing the continuous exposure pattern from the required thickness profile, and the thickness versus exposure response of the photoresist.

5. The method claimed in claim 4, wherein said step of exposing said layer of photoresist with said exposure pattern comprises the steps of:
   a. generating an intermediate master for producing said exposure pattern by scan exposing a high resolution photographic film; and
   b. exposing said layer of photoresist by contact printing through said master.

6. The method claimed in claim 5, wherein said step of generating an intermediate master comprises the steps of:
   a. producing a look-up table relating exposure of the high resolution photographic film to phase delay response of the developed photoresist; and
   b. exposing the high resolution photographic film in a film scanner and employing the look-up table to relate desired phase to exposure.

7. A method of making a continuous phase mask having a desired two-dimensional continuous phase profile, for shaping the spot from a laser beam having a wavelength $\lambda$, comprising the steps of:
   a. providing a layer of UV sensitive photoresist transparent to laser light of wavelength $\lambda$, said photoresist having a known index of refraction and thickness versus UV exposure response;
   b. providing a high resolution photographic film, said film having a known exposure versus UV density response;
   c. cascading the known index of refraction, thickness versus UV exposure response, and exposure versus density response to produce a computer look-up table of integer code values necessary to effect the desired phase response in the final step of fabrication;
   d. exposiing said high resolution film in a film scanner with said two-dimensional phase profile employing said look-up table to determine exposure values from desired phase values;
   e. developing the exposed photographic film to produce an intermediate mask;
   f. contact printing said intermediate mask onto said layer of photoresist with UV exposure; and
   g. developing the exposed layer of photoresist to produce said continuous phase mask.

* * * * *